US006969541B2

(12) United States Patent
Kreutzkämper et al.

(10) Patent No.: US 6,969,541 B2
(45) Date of Patent: Nov. 29, 2005

(54) METHOD AND DEVICE FOR STRUCTURING A SURFACE TO FORM HYDROPHILIC AND HYDROPHOBIC REGIONS

(75) Inventors: Jürgen Kreutzkämper, Sinsheim-Hoffenheim (DE); Gotthard Schmid, Malsch (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 267 days.

(21) Appl. No.: 10/205,079

(22) Filed: Jul. 25, 2002

(65) Prior Publication Data

US 2003/0020802 A1 Jan. 30, 2003

Related U.S. Application Data

(60) Provisional application No. 60/308,281, filed on Jul. 26, 2001.

(30) Foreign Application Priority Data

Jul. 25, 2001 (DE) ................................ 101 36 068

(51) Int. Cl.[7] ............................ B05D 3/10; B05D 3/06; C08J 7/12; C23C 16/04; C23C 16/48; C23C 16/56

(52) U.S. Cl. ...................... 427/552; 427/553; 427/555; 427/299; 427/307; 427/255.4; 427/255.6; 430/201; 430/300; 430/302; 430/309; 430/310

(58) Field of Search ................................ 427/509, 510, 427/497, 511, 504, 553, 551, 554, 552, 555, 427/556, 558, 534, 536, 539, 537; 430/200, 430/201, 300, 302, 309, 310

(56) References Cited

U.S. PATENT DOCUMENTS

| | | | | |
|---|---|---|---|---|
| 4,275,092 | A * | 6/1981 | Nakayama et al. | 427/511 |
| 4,430,089 | A * | 2/1984 | Toy et al. | 8/115.53 |
| 5,378,502 | A * | 1/1995 | Willard et al. | 427/305 |
| 6,145,953 | A | 11/2000 | Medin | |
| 6,231,930 | B1 * | 5/2001 | Klebanoff | 427/488 |
| 6,375,302 | B1 | 4/2002 | Medin | |
| 6,461,792 | B1 * | 10/2002 | Kawamura et al. | 430/271.1 |
| 6,694,880 | B1 * | 2/2004 | Mori et al. | 101/467 |

FOREIGN PATENT DOCUMENTS

| | | | | |
|---|---|---|---|---|
| DE | 44 26 012 C2 | | 1/1996 | |
| EP | 0 503 621 A1 | | 9/1992 | |
| EP | 0 931 647 A1 | | 7/1999 | |
| EP | 0 931 657 A1 | | 7/1999 | |
| EP | 1 046 497 A1 | | 10/2000 | |
| EP | 1 084 863 A1 | | 3/2001 | |
| JP | 5-68934 | * | 3/1993 | 427/553 |
| JP | 2000-193816 | * | 7/2000 | |

* cited by examiner

*Primary Examiner*—Marianne Padgett
(74) *Attorney, Agent, or Firm*—Laurence A. Greenberg; Werner H. Stemer; Ralph E. Locher

(57) ABSTRACT

A method for structuring a surface includes, by an assigned modification device, creating a latent structure of at least a first layer of the surface, which has a polymer therein, so as to form hydrophilic and hydrophobic regions for producing a printing form for offset printing, by selectively applying a gaseous, readily volatile solvent as a modifying agent to at least one locally limited region of the surface over at least one exposure time interval. A device for performing the method, a printing form exposer, a printing unit and a printing machine including the surface-structuring device according to the invention, are also provided.

10 Claims, 4 Drawing Sheets

METHOD AND DEVICE FOR STRUCTURING A SURFACE TO FORM HYDROPHILIC AND HYDROPHOBIC REGIONS

CROSS-REFERENCE TO RELATED APPLICATION

This application claims the benefit of Provisional Application No. 60/308,281, filed Jul. 26, 2001.

BACKGROUND OF THE INVENTION

1. Field of the Invention

The invention relates to a method for structuring a surface, which comprises creating a latent structure of at least a first layer having a polymer for forming hydrophilic and hydrophobic regions by an assigned modification device for producing a printing form for offset printing.

Furthermore, the invention relates to a device for structuring a surface which comprises at least a first layer having a polymer for forming hydrophilic and hydrophobic regions by creating a latent structure of the first layer for producing a printing form for offset printing.

Printing forms whereon the surface has an outer layer of polymer material, in particular polystyrene, styrene copolymers and the like, and an inner layer of metallic material, such as aluminum, for example, have already been in use for some time in the polygraphic industry. Printing forms of this type are typically structured from an unstructured or undifferentiated state for use in offset printing for forming hydrophilic and hydrophobic regions or subregions according to the subject to be printed. A common structuring method comprises the locally selective modification of the outer layer of the surface by temporally and spatially selective exposure to the action of electromagnetic energy, in particular laser radiation, and subsequent development of the latent structure to form hydrophobic and hydrophilic regions by removal, for example using chemicals, such as for example printing-form cleaning agents, of the non-modified regions of the outer layer so that hydrophilic regions of the structure are formed for the most part by the exposed inner layer of the surface, while the modified regions of the outer layer are the hydrophobic regions of the structure.

A printing form whereon the surface can be structured by exposure to the action of thermal laser energy and subsequent chemical treatment to form hydrophilic and hydrophobic regions is disclosed, for example, in European Patent Application EP 0 931 647 A1. In addition to a polymer containing carboxyl groups, the surface, in this case, also has styrene. Furthermore, to support the absorption of laser energy, an anionic dye is provided in the surface or adjacent thereto.

In European Patent Application EP 0 931 657 A1, corresponding to U.S. Pat. Nos. 6,145,953 and 6,375,302, a method for producing an offset printing form is disclosed. After the image-related exposure of the printing form with infrared light, the image-related regions are developed by applying an aqueous liquid to the surface of the printing form. This described method can be performed, in particular, on the printing form cylinder of a printing unit or within a printing machine.

German Patent DE 44 26 012 C2 also discloses an erasing and hydrophilizing device on a printing unit in connection with erasable, i.e., regeneratable, printing forms. A cleaning fluid, an hydrophilizing agent, is sprayed either directly onto the printing form or an assigned cleaning cloth. At the circumference of the cylinder accommodating the printing form thereon, an imaging device is provided.

Conventional imaging processes for printing forms, in particular within printing units or printing machines, share a common feature that the imaging process or the structuring process is primarily based upon the interaction of light, whether by thermal or reactive effect, with the surface of the printing form. The manner wherein this is realized technically therefore requires an often sophisticated and complex imaging device, which comprises one or more light sources, in particular laser light sources. An imaging device of this type with laser light sources entails considerable costs both in procurement and in use.

SUMMARY OF THE INVENTION

It is accordingly an object of the invention, therefore, to provide a method and a device for structuring a surface to form hydrophilic and hydrophobic regions, the costs both for procurement and for operation of which are reduced over heretofore known methods and devices of this general type.

With the foregoing and other objects in view, there is provided, in accordance with one aspect of the invention, a method for structuring a surface, which comprises, by an assigned modification device, creating a latent structure of at least a first layer of the surface, which has a polymer therein, so as to form hydrophilic and hydrophobic regions for producing a printing form for offset printing, by selectively applying a gaseous, readily volatile solvent as a modifying agent to at least one locally limited region of the surface over at least one exposure time interval.

In accordance with another mode, the method of the invention further comprises providing the first layer with polystyrene therein, and providing the surface with a second layer which is selected from the group consisting of being metallic and having polyester therein, respectively; and developing the latent structure at least in one region of the surface so that the first layer is removed in regions other than those having been selectively modified.

In accordance with a further mode, the surface-structuring method of the invention further comprises translatorily moving the modification device so that the modification device can selectively reach regions of the surface along the two dimensions thereof spanning the surface, at least one of successively and at least partly in parallel.

In accordance with an added mode, the surface-structuring method of the invention further comprises radiating electromagnetic energy at least onto the locally limited region of the surface.

In accordance with an additional mode, the surface-structuring method of the invention further comprises radiating electromagnetic energy during the application of the gaseous, readily volatile solvent.

In accordance with another aspect of the invention, there is provided a device for structuring a surface formed of at least a first layer having a polymer therein for forming hydrophilic and hydrophobic regions by creating a latent structure of the first layer for producing a printing form for offset printing, comprising a modification device for applying a gaseous, readily volatile solvent to a locally limited region of the surface over at least one exposure time interval.

In accordance with a further feature of the invention, the surface comprises at least a first layer having polystyrene therein, and a second layer which is selected from the group consisting of being metallic and having polyester therein, respectively.

In accordance with an added feature of the invention, the modification device reaches the locally limited region and at least another locally limited region of the surface temporally and spatially in parallel.

In accordance with an additional feature of the invention, the surface-structuring device further comprises a light source for radiating electromagnetic energy onto at least the locally limited region of the surface.

In accordance with still another feature of the invention, the surface-structuring device further comprises a control unit for making available assigned structural information at the modification device, at the latest before modification of each selective region.

In accordance with still a further feature of the invention, the gaseous, readily volatile solvent comprises at least one of an alcohol (R—OH), an aldehyde (R—HO), a ketone ($R_1$—CO—$R_2$) and an ester ($R_1$—COO—$R_2$).

In accordance with still an added feature of the invention, the gaseous, readily volatile solvent comprises at least one compound selected from the group thereof consisting of ethanol ($C_2H_5$—OH), 4-hydroxy-4-methyl-2-pentanone, 3-butoxy-2-propanol, ethanal ($CH_3$—CHO), acetone ($CH_3$—CO—$CH_3$) and acetic ester ($CH_3$—COO—$C_2H_5$).

In accordance with another aspect of the invention, there is provided a printing form exposer including at least one device for structuring a surface formed of at least a first layer having a polymer therein for forming hydrophilic and hydrophobic regions by creating a latent structure of the first layer for producing a printing form for offset printing, comprising a modification device for applying a gaseous, readily volatile solvent to a locally limited region of the surface over at least one exposure time interval.

In accordance with a further aspect of the invention, there is provided a printing unit including at least one device for structuring a surface formed of at least a first layer having a polymer therein for forming hydrophilic and hydrophobic regions by creating a latent structure of the first layer for producing a printing form for offset printing, comprising a modification device for applying a gaseous, readily volatile solvent to a locally limited region of the surface over at least one exposure time interval.

In accordance with a concomitant aspect of the invention, there is provided a printing machine including at least one device for structuring a surface formed of at least a first layer having a polymer therein for forming hydrophilic and hydrophobic regions by creating a latent structure of the first layer for producing a printing form for offset printing, comprising a modification device for applying a gaseous, readily volatile solvent to a locally limited region of the surface over at least one exposure time interval.

The method according to the invention for structuring a surface which comprises at least a first layer having a polymer, for example polystyrene, polyimide, polysilane or the like, to form hydrophilic and hydrophobic regions by creating a latent structure of the first layer by an assigned modification device for producing a printing form for offset printing is distinguished by the fact that a gaseous, readily volatile solvent is selectively applied as a modifying agent to at least one locally limited region of the surface over at least one exposure time interval. Besides the exposure time interval, parameters for the gas flow, such as the gas pressure, the flow rate, the extent of the flow field and the like, are defined. In connection with the invention, a latent structure is understood to be a structuring which comprises regions of the surface with at least two contrasting properties. An example thereof is the property pairing of hydrophilicity-hydrophobicity, or else oleophilicity-oleophobicity. The term latent structure is also to be understood as concerning a structure which potentially, possibly with the assistance of one or more additional method steps, also referred to as development, leads to a structure with at least two contrasting properties.

If the surface, as preferred, comprises at least a first layer having polystyrene, and a second layer that is metallic or has polyester, in the method according to the invention, the latent structure is furthermore developed at least in one region of the surface in such a way that the first layer is removed in those regions which have not been selectively modified. The second layer preferably has aluminum therein. It is particularly advantageous if the modification device can selectively reach regions of the surface along the two dimensions spanning the latter, successively or at least partly in parallel, by translatory movement.

According to the invention, the method for structuring a surface which comprises at least two layers, the first layer of which having polystyrene and the second layer possibly being metallic or having polyester, by modification of the first layer and subsequent development to form hydrophilic and hydrophobic regions for producing a printing form for offset printing, preferably comprises a number of steps. The first layer of the surface of the printing form in the unstructured state is assigned to a modification device; for example, this assignment takes place by providing an arrangement wherein the modification device lies opposite the surface. For example, the printing form may be accommodated on a cylinder, in particular a printing form cylinder within a printing unit, rotatably about the axis of the cylinder. The modification device can selectively reach regions of the surface along the two dimensions thereof, which span the surface, successively or at least partly in parallel by translatory movement with suitable equipment, such as actuators, linear drives, spindle drives and the like. If necessary or desirable, the cylinder has a drive assigned thereto for producing a rotational movement about the axis of the cylinder. At the latest before the modification of each selective region, the structural information assigned to this region is made available at the modification device. In this regard, the structural information corresponds at least to the structure of the desired printing subject. By selective application of a modifying agent to regions of the surface, a latent structure is created. Employed here in accordance with the invention as a modifying agent is a gaseous, readily volatile solvent, which is applied to a locally limited region of the surface over at least one exposure time interval. The gaseous, readily volatile solvent may, in this regard, comprise an alcohol (R—OH) and/or an aldehyde (R—HO) and/or a ketone ($R_1$—CO—$R_2$) and/or an ester ($R_1$—COO—$R_2$). In connection with the invention, R, $R_1$ or $R_2$ may designate an aliphatic radical, in particular a hydrocarbon chain, but also an aliphatic radical substituted with further functional groups, or an aromatic radical. R, $R_1$ and $R_2$ may be identical or different. The latent structure is developed, at least in one region of the surface, in such a way that the first layer is removed in those regions which have not been selectively modified. This results in a developed printing form with hydrophilic and hydrophobic regions. The hydrophilic regions are formed primarily by the exposed second layer, and the hydrophobic regions are formed primarily by the first layer of the printing form, modified by the exposure to the action of the gaseous, readily volatile solvent. The method according to the invention represents a simple and low-cost possible way of producing a printing form.

In advantageous developments of the method according to the invention for structuring a surface, electromagnetic energy, preferably emitted by a light source in the form of laser radiation, is radiated at least onto the locally limited region of the surface which is, has been or is to be modified by applying the gaseous, readily volatile solvent. Provision may be made for introducing the electromagnetic energy during the application of the gaseous, readily volatile solvent to the locally limited region. However, a type of pre-treatment or type of post-treatment of the region to be modified by electromagnetic energy may also be advantageous. In other words, the effective time interval of applying the gaseous, readily volatile solvent may coincide at least approximately with the time interval of exposure to electromagnetic energy or may also be different. It is believed to be understood that the intervals under consideration may also, respectively, have a number of subintervals. The energy provided by the light source on the surface supports the action of the gaseous, readily volatile solvent on the first layer of the surface in an advantageous manner.

The device according to the invention for structuring a surface, which comprises at least a first layer having a polymer for forming hydrophilic and hydrophobic regions by creating a latent structure of the first layer for producing a printing form for offset printing, is distinguished by the fact that a modification device applies a gaseous, readily volatile solvent to a locally limited region of the surface over at least one exposure time interval. The surface preferably comprises at least a first layer, which has polystyrene therein, and a second layer, which may be metallic or has polyester therein.

A preferred embodiment of the device according to the invention for structuring a surface, which comprises at least two layers, the first layer having polystyrene and the second layer possibly being metallic or having polyester therein, by selective modification of the first layer and subsequent development to form hydrophilic and hydrophobic regions for producing a printing form for offset printing, is distinguished by the fact that a modification device applies a gaseous, readily volatile solvent to a locally limited region of the surface of the printing form over at least one exposure time interval. The device may typically comprise a control unit or be connected to a control unit. At the latest before the modification of each selective region, assigned structural information is made available by the control unit at the modification device. Furthermore, equipment for producing a relative movement, for example by actuators, spindle drives, servo motors, linear motors and the like, between the modification device and the surface of the printing form are provided. It is particularly advantageous if the modification device reaches at least two locally limited regions of the surface temporally and spatially in parallel. This makes it possible to reduce the time for the modification of regions on the overall surface by parallel processing.

In an advantageous development of the device according to the invention for structuring a surface, there is additionally provided a light source, preferably a laser light source, for radiating electromagnetic energy onto at least one locally limited region of the surface, in particular onto the locally limited region of the surface to be modified. It is believed to be readily apparent that equipment for producing a relative movement between the light source and the surface analogous to those or identical to those for producing the relative movement between the modification device and the surface may possibly be provided, with the result that, respectively, the locally limited region of the surface to be modified can be reached both by the electromagnetic energy and by the modifying agent.

In a particularly advantageous embodiment of the invention, the gaseous, readily volatile solvent comprises ethanol ($C_2H_5$—OH) and/or 4-hydroxy-4-methyl-2-pentanone and/or 3-butoxy-2-propanol and/or ethanal ($CH_3$—CHO) and/or acetone ($CH_3$—CO—$CH_3$) and/or acetic ester ($CH_3$—COO—$C_2H_5$).

The device according to the invention for structuring a surface may be advantageously used in a printing form exposer or in a printing unit, known as a direct-imaging printing unit. A printing machine according to the invention which, for processing sheets typically comprises a feeder, one or more printing units and a delivery unit, or for the processing of paper webs comprises a reel changer, at least one printing unit, a dryer and a folder, is distinguished by at least one printing unit which has at least one device according to the invention for structuring a surface.

Other features which are considered as characteristic for the invention are set forth in the appended claims.

Although the invention is illustrated and described herein as a method and device for structuring a surface to form hydrophilic and hydrophobic regions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1B:
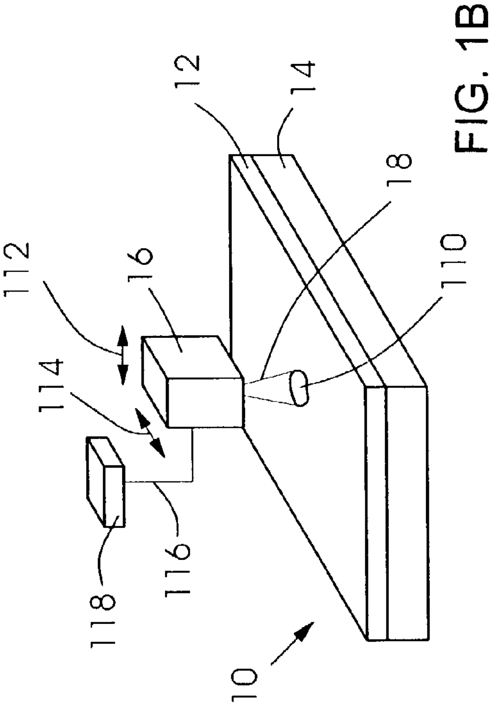
FIGS. 1*a* to 1*d* are diagrammatic perspective views showing four steps in a preferred mode of the method according to the invention for structuring a surface.
Figure 1D:
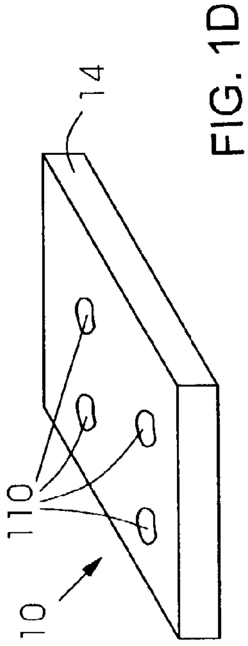
Figure 1A:
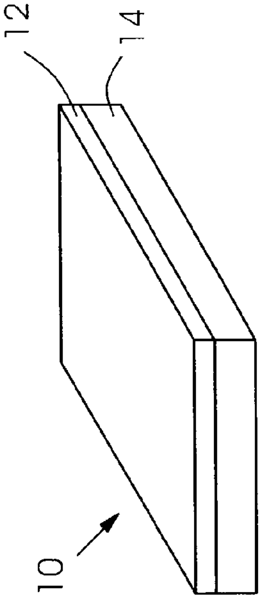

Referring now to the drawings and, first, particularly to FIGS. 1*a* to 1*d* thereof, there is shown therein diagrammatic views representing four steps, respectively, of a preferred mode of the method according to the invention for structuring a surface. In FIG. 1*a*, a printing form 10 with a first layer 12 and a second layer 14 is shown. In connection with the embodiments depicted in FIGS. 1*a* to 1*d* and the succeeding figures, the first layer 12 may also be referred to as the outer layer and the second layer 14 may also be referred to as the inner layer. Besides these layers on the surface of the printing form 10, the latter may also comprise further layers in the depth thereof or may be accommodated on a support; for the method according to the invention, it is quite immaterial whether the printing form is flat or curved. The first layer 12 is formed, in this case, of polystyrene. In connection with the invention, polystyrene is to be understood as being either or both at least approximately pure polystyrene and polystyrene copolymers, for example polymers containing carboxyl groups. The second layer 14 may be metallic, preferably comprising aluminum. An alternative material which has proven to be advantageous is polyester. Without restricting the generality with respect to the initial state of the structure of the surface of the printing form 10, the method according to the invention starts out from an unstructured first layer 12, as shown in the embodiment of FIG. 1*a*.

In FIG. 1*b*, the printing form 10 with the first layer 12 disposed above the second layer 14 is arranged lying opposite a modification device 16. A gaseous, readily volatile solvent 18, comprising the substances described hereinabove, is applied from the modification device 16 to a region of the printing form 10 in a locally limited manner, for example through outlet nozzles. It is likewise conceivable for the gaseous, readily volatile solvent 18 to be applied to the surface of the printing form 10 by flexible lines, such as hoses or the like. The action of the gaseous, selective solvent 18 produces a modified surface 110. The double-headed arrows represent a first translational direction 112 and a second translational direction 114, respectively, wherein the modification device 16 is movable in relation to the printing form 10 in such a way that regions of the surface can be selectively reached in succession along the two dimensions spanning the printing form 10. The modification device 16 is preferably linked by a connection for an exchange of data and/or control signals 116, which may also be partly wireless, to a control unit 118. At the latest, before the modification of each selective region, structural information assigned to the region to be modified is made available at the modification device 16 by the control unit 118.

Figure 1C:
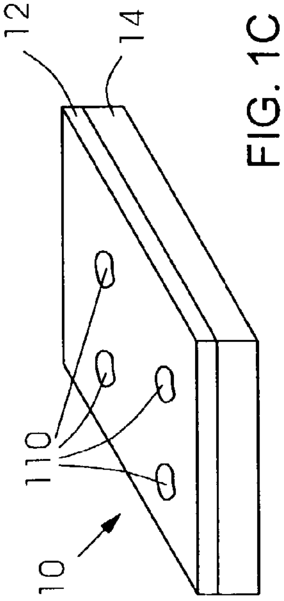

In FIG. 1*c*, a latent structure formed by the modification device 16 and made up of a number of modified surfaces 110, is shown on and/or in the first layer 12 of the printing form 10. The action of the gaseous, readily volatile solvent is directed at the first layer 12 of the printing form 10, but an increase in the adhesion of the first layer 12 to the second layer 14 of the printing form 10 can also be additionally achieved. The latent structure corresponds to the hydrophobic component of the image-related structuring, i.e., it comprises the ink-carrying hydrophobic regions of the surface of the printing form in offset printing.

For the development of the latent structure of the printing form 10, at least in one region of the surface, the first layer 12 is removed in those regions which have not been modified selectively. Removal of the first, non-modified layer 12 is possible, for example, by using a cleaning fluid, namely a common printing-form cleaning agent. Due to the modification of the first layer 12 in the method according to the invention, a number of modified surfaces 110 remain on the printing form, while the second layer 14 is exposed. The second layer 14 is provided with the function of the hydrophilic regions in offset printing. The structuring to form hydrophilic and hydrophobic regions provided by the method according to the invention is diagrammatically represented in FIG. 1*d*.

Figure 2:
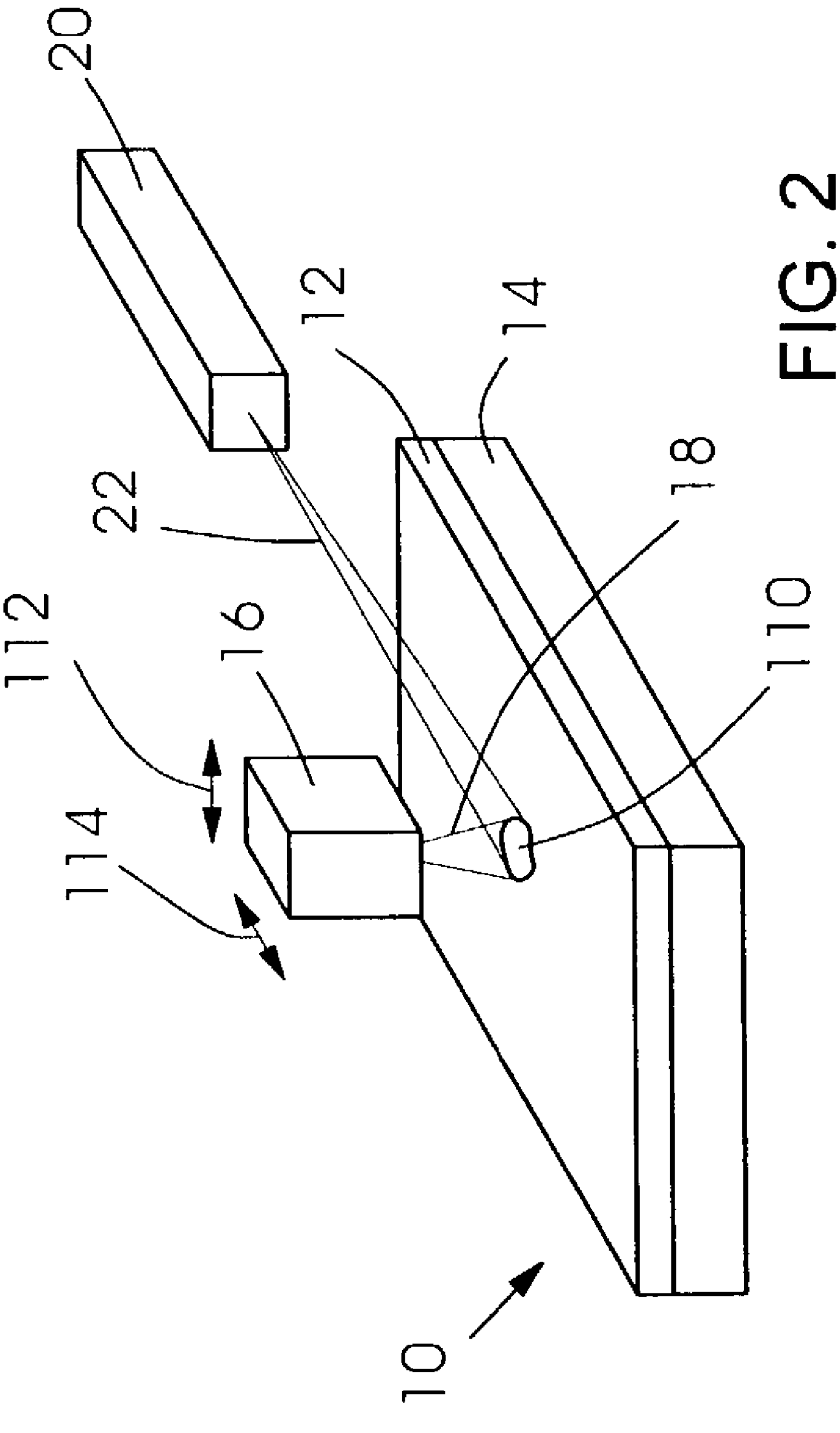
FIG. 2 is a diagrammatic perspective view of an embodiment of the device according to the invention with an advantageous development of an additional light source.

FIG. 2 is a diagrammatic perspective representation of an embodiment of the device according to the invention similar to that of FIG. 1*b*, but having an advantageous further development in the form of an additional light source. A printing form 10 with a first layer 12 and a second layer 14 is shown. The printing form 10 is disposed so as to lie opposite a modification device 16. The modification device 16 applies a gaseous, readily volatile solvent 18 to a region of the printing form 10 in a locally limited, temporally and spatially selective manner. A modified surface 110 is produced on the printing form 10. The modification device 16 is movable in a first translational direction represented by a double-headed arrow 112 and a second translational direction represented by the double-headed arrow 114, in relation to the printing form 10. The modification device 16 has a light source 20 assigned thereto, preferably a laser light source emitting, in particular, in the infrared wavelength range. A light beam 22 illuminates at least the region of the printing form 10 which is modified by the action of the gaseous, readily volatile solvent 18, with the result that the modified surface 110 is produced.

Figure 3B:
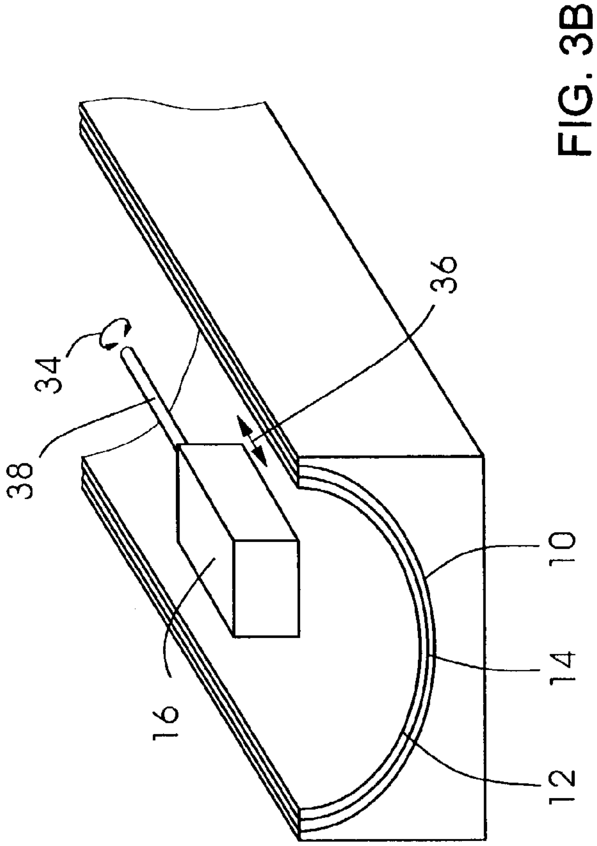
FIG. 3*b* is a diagrammatic perspective view of another embodiment of the surface-structuring device within a printing form exposer.
Figure 3A:
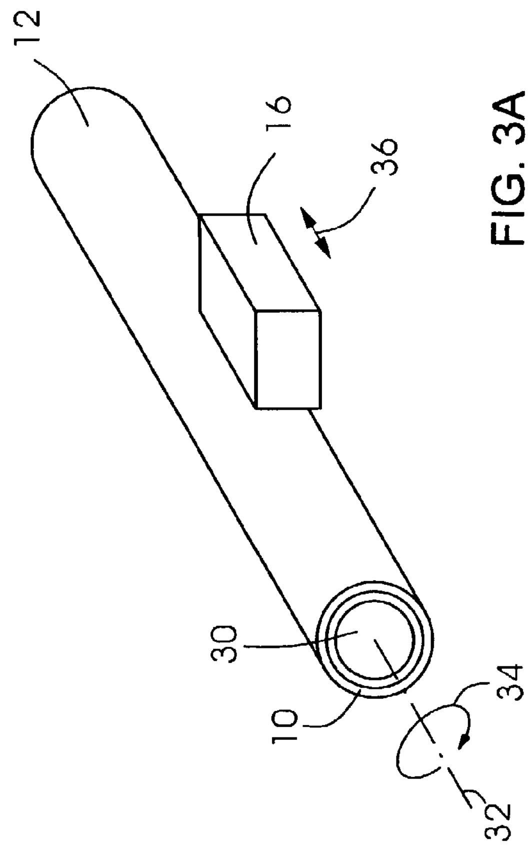
FIG. 3*a* is a diagrammatic perspective view of an embodiment of the surface-structuring device in a printing unit.

FIGS. 3*a* and 3*b* are diagrammatic perspective views of two different embodiments of the surface structuring device according to the invention, which are disposed, respectively, in a printing unit and within a printing form exposer. Shown in FIG. 3*a* is a device as may be realized preferably in a printing unit wherein the printing form 10 provided with the first layer 12 and the second layer 14 is accommodated on a cylinder 30. The cylinder 30 is rotatable about an axis 32 thereof in a rotational direction represented by the circular arrow 34. Assigned to the first layer 12 of the printing form 10 is the modification device 16, which is movable along the translational direction represented by the double-headed arrow 36 at least approximately parallel to the axis 32 of the cylinder 30. In the combination of the rotational and translational movement, all points on the surface of the printing form 10 are able to be reached by the modification device 16. Shown in FIG. 3*b* is an embodiment of what is known as an in-drum device. In other words, the printing form 10 with the first layer 12 and the second layer 14 is accommodated in a concave manner, so that the assigned modification device 16, which is disposed on a shaft 38, is able to reach all points of the surface of the printing form 10 by movement in the translational direction represented by the double-headed arrow 36, at least approximately parallel to the direction in which the shaft 38 extends, and by rotation in the rotational direction 34 represented by the circular arrow 34 about the axis defined by the shaft 38.

Figure 4A:
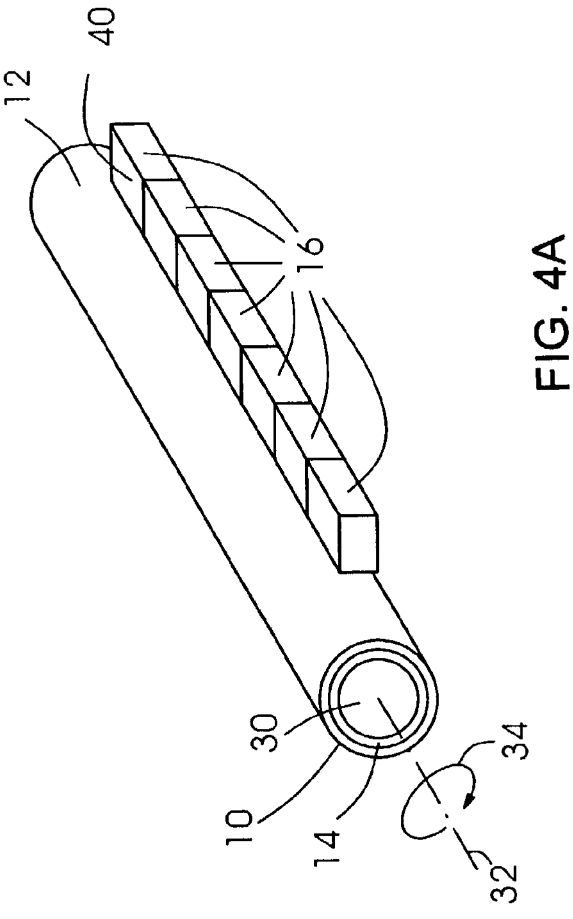
FIGS. 4*a* and 4*b* are respective diagrammatic perspective views similar to that of FIG. 3*a* of two different embodiments of the device according to the invention for simultaneously modifying more than one region of the first layer of the surface.
Figure 4B:
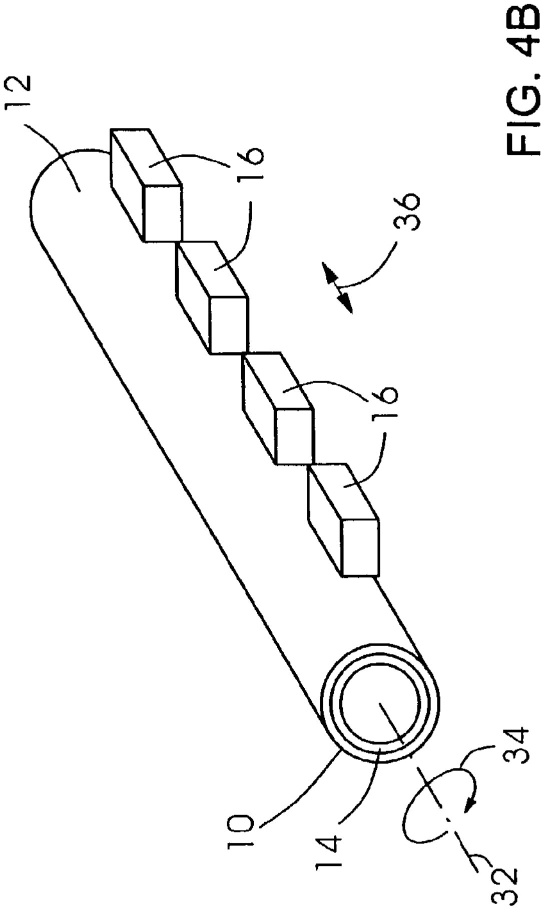

FIGS. 4*a* and 4*b* are diagrammatic perspective representations of two different embodiments of the device according to the invention for a simultaneous modification of more than one region of the first layer of the surface. Shown in FIG. 4*a* are a number of modification devices 16, being here, by way of example and without restricting generality, seven modification devices 16, which are assigned to the first layer 12, disposed opposite thereto, of the printing form 10 with the first layer 12 and the second layer 14 accommodated on the cylinder. The cylinder 30 is rotatable about the axis 32 thereof in a rotational direction represented by the circular arrow 34. The number of modification devices 16 are configured as an integrated modification device 40. In other words, this embodiment of the device according to the invention comprises an integrated modification device 40 which has, in a modular manner, a plurality of modification devices 16 for applying a gaseous, readily volatile solvent to a locally limited region of the surface of the printing form 10. Shown in FIG. 4*b*, in an alternative embodiment of the device according to the invention, are a number of modification devices 16, being here, by way of example, four modification devices 16, which are arranged so that they lie opposite the printing form 10 accommodated on the cylinder 30. Respective subregions of the overall surface of the printing form 10 are reached by a modification device 16 and exposed in an image-related manner to the gaseous, readily volatile solvent 18. With the embodiments shown in FIGS. 4*a* and 4*b*, a parallel or simultaneous modification of at least two regions of the surface of the printing form 10 is at least partly possible.

We claim:

1. A method for structuring a surface, which comprises:

providing a surface having at least a first layer with a polymer for forming hydrophilic and hydrophobic regions;

selecting a volatile solvent in a gaseous state from at least one of the group consisting of an alcohol, an aldehyde, a ketone and an ester; and creating a structure of hydrophilic and hydrophobic regions on the surface for producing a printing form for offset printing by applying the volatile solvent in a gaseous state as a modifying agent with a modification device to at least one locally limited region of the surface over at least one exposure time interval and by removing the first layer in regions other than those having been selectively modified.

2. The surface-structuring method according to claim 1, which further comprises translatorily moving the modification device for permitting the modification device to selectively reach regions of the surface along the two dimensions spanning the surface.

3. The surface-structuring method according to claim 1, which further comprises radiating electromagnetic energy during the application of the gaseous volatile solvent.

4. The method according to claim 1, which further comprises:

providing polystyrene in the first layer; and providing the first layer on a second layer selected from the group consisting of a metallic layer and a layer having polyester.

5. The method according to claim 1, which further comprises reaching, with the modification device, the locally limited region and at least another locally limited region of the surface simultaneously and spatially in parallel.

6. The method according to claim 1, which further comprises radiating electromagnetic energy onto at least the locally limited region of the surface with a light source.

7. The method according to claim 1, which further comprises making available assigned structural information at the modification device from a control unit, at the latest, before modification of each selective region.

8. The method according to claim 1, which further comprises selecting one compound of the gaseous volatile solvent from the group consisting of ethanol ($C_2H_5$—OH), 4-hydroxy-4-methyl-2-pentanone, 3-butoxy-2-propanol, ethanal ($CH_3$—CHO), acetone ($CH_3$—CO—$CH_3$) and acetic ester ($CH_3$—COO—$C_2H_5$).

9. The method according to claim 1, wherein the method is performed in a printing form exposer.

10. The method according to claim 1, wherein the method is performed in a printing unit.

* * * * *